United States Patent
Moldsvor

(10) Patent No.: US 6,310,515 B1
(45) Date of Patent: Oct. 30, 2001

(54) CMOS TRACK AND HOLD AMPLIFIER

(75) Inventor: Øystein Moldsvor, Tiller (NO)

(73) Assignee: Nordic VLSA ASA, Tiller (NO)

( * ) Notice: Subject to any disclaimer, the term of this patent is extended or adjusted under 35 U.S.C. 154(b) by 0 days.

(21) Appl. No.: 09/521,013

(22) Filed: Mar. 8, 2000

(30) Foreign Application Priority Data

Mar. 18, 1999 (NO) .................................................. 991320

(51) Int. Cl.[7] .................................................. H03F 1/08
(52) U.S. Cl. .................................. 330/9; 327/95; 327/96
(58) Field of Search .............................. 327/94, 95, 96, 327/336, 337, 344, 345, 554; 330/9, 51, 69

(56) References Cited

U.S. PATENT DOCUMENTS

| | | | |
|---|---|---|---|
| 5,572,154 | * | 11/1996 | Rakers et al. .......................... 327/92 |
| 5,638,020 | * | 6/1997 | Koifman et al. ...................... 327/382 |
| 5,644,257 | * | 7/1997 | Kerth et al. ............................. 327/96 |

* cited by examiner

*Primary Examiner*—Tuan T. Lam
(74) *Attorney, Agent, or Firm*—Marshall, Gerstein & Borun

(57) ABSTRACT

A switched Capacitor Track and Hold Amplifier having at least one signal input, at least one clock input and an output, comprising a sampling capacitor, a buffer amplifier connected between the input signal and the first plate of the sampling capacitor having high output impedance in the odd clock phase, a switch connected between the second plate of the sampling capacitor and a signal ground being closed in the even clock phase, means for copying the sampled input voltage to the output in the hold phase and means for controlling the output impedance of the input buffer amplifiers.

2 Claims, 1 Drawing Sheet

CMOS TRACK AND HOLD AMPLIFIER

RELATED APPLICATIONS

This Application claims priority under 35 U.S.C. §119 from Norway Patent Application No. 1999 1320, filed Mar. 18, 1999.

1. Technical Field

The present invention is related to a switched Capacitor Track and Hold Amplifier having at least one signal input, at least one clock input and an output.

2. Background

CMOS THAs are generally implemented as switched capacitor (SC) circuits. This type of THA is commonly used in the industry and substantial effort has been put into the optimization of the architecture and switch configuration to reduce the effect of non-idealities. A typical implementation of a switched capacitor THA is shown in FIG. 1.

The circuit operates in two phases. In phase 1, the sampling phase, the switches labelled φ1 are closed. In phase 2, the hold phase, the switches labelled φ2 are closed. The phases are non-overlapping so that the φ1 switches are opened a short instant before the φ2 switches are closed. In phase 1 the input signal is charging the sampling capacitors C1 and C2. At the end of phase 1 switches S3 and S4 opens prior to S1 and S2. The sampling instant is therefore controlled only by the switches S3 and S4. When all switches are open, the input voltage is stored on the sampling capacitors. In phase 2 the switches S5 and S6 are closed, copying the sampled voltage to the THA output. The gain of the operational transconductance amplifier (OTA) must be high in order to maintain a high accuracy.

The switches in FIG. 1 are implemented as MOS transistors. A symbol of a N-type MOS transistor (NMOS) is shown in FIG. 2.

When the MOS transistor is operated as a switch, it acts like a voltage controlled resistance. The device is symmetrical so that source may act like drain and drain may act like source determined by the voltages at the different nodes. A NMOS device is switched on when the voltage between gate and source ($V_{GS}$) goes higher than the threshold voltage ($V_T$) of the device. A PMOS device is switched on when $V_{GS}$ goes more negative than the $V_T$ (negative for PMOS) of the device.

The switch ON-resistance is determined by $V_{GS}-V_T$. In addition $V_T$ is changed by the voltage between bulk and source. The switches in a SC circuit is normally controlled by CMOS digital signals. The gates are therefore either connected to ground or to the supply voltage. As a result of this, $V_{GS}-V_T$ and therefore also the switch ON-resistance for some of the switches, is dependent on the voltage of the signal nodes in the circuit.

Switch S5 and S6 in FIG. 1 is not sensitive to the switch ON-resistance since the output signal settles to a constant voltage in the hold phase and the current through the switch goes to zero. Switch S3 and S4 are connected with source to ground and $V_{GS}-V_T$ is therefore kept constant. The input switches have their source connected to the input signal and $V_{GS}-V_T$ is directly controlled by the input voltage. As a result of this, the switch ON-resistance is modulated by the input signal and haimonic distortion results when a high frequency input signal is applied to the circuit.

This problem is known from prior air, and several principles have been proposed to enhance the performance of the input switch.

BRIEF DESCRIPTION OF THE DRAWINGS

Features and advantages of the disclosed system will be apparent to those of ordinary skill in the art in view of the detailed description of exemplary embodiments which is made with reference to the drawings, a brief description of which is provided below.

DETAILED DESCRIPTION

The input switch ON-resistance can be made less dependent on the input voltage by implementing the input switch as a parallel connection of a NMOS and a PMOS transistor. When the switch is on, the gate of the NMOS is connected to the supply voltage and the gate of the PMOS is connected to ground. The source of the two devices is connected to the input signal. In this way $V_{GS}-V_T$ for one transistor decreases if it increases for the other. By scaling the two devices correctly, the ON-resistance variation can be cancelled to the first order. This cancellation is not sufficient for many applications. The input switch ON-resistance variation can be reduced by controlling the gate voltage of the transistor. This method is referred to as bootstrapping. In a bootstrapped switch, the $V_{GS}-V_T$ for the transistor is kept constant by applying a gate voltage equal to the input voltage plus a dc-offset. In practice, it is very difficult to generate the gate voltage with the required accuracy.

A considerable problem with both the proposed principles is that the resistance of MOs transistors often is poorly modelled. This complicates the analysis of the THA since the simulation results obtained with circuit simulators are very inaccurate.

Substantial improvements in performance and designability are achieved with the THA configuration according to the present invention as defined by the features of the claims. The new CMOS track and hold amplifiers (THA) configuration ensures low distortion.

Figure 3:
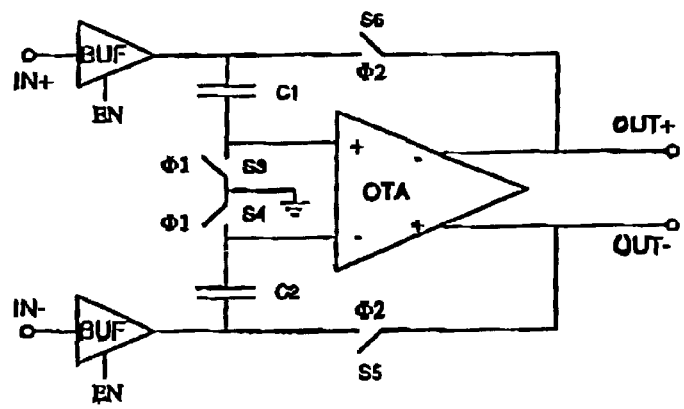
FIG. 3 is a schematic circuit diagram of a preferred embodiment of a switched capacitor track and hold amplifier using voltage follower buffers.

FIG. 3 discloses schematically the invented THA configuration.

Figure 1:
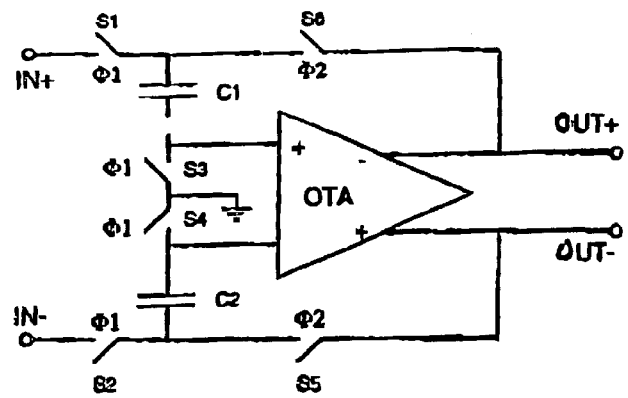
FIG. 1 is schematic circuit diagram of a prior art switched capacitor track and hold amplifier.
Figure 2:
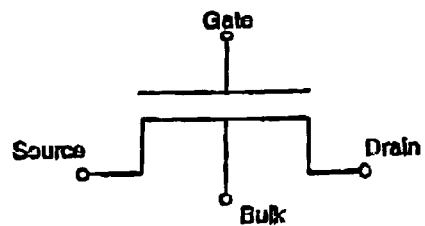
FIG. 2 is a more detailed schematic circuit diagram of one of one the switches of FIG. 1 implemented as an N-type MOS transistor.

The THA configuration according to the present invention is based on using voltage follower buffers (gain=1) as input switches. In the hold phase, the new configuration acts exactly equal to the solution shown in FIG. 1. In the sampling phase, the input signal is buffered before it is connected to the sampling capacitors. This eliminates the signal dependent switch ON-resistance of the input switches. The buffers are controlled by digital enable signals (EN in FIG. 3). With EN equal to one, the buffer acts like a voltage follower corresponding with a closed switch. With EN is equal to zero, the buffer is shut off, having a high output impedance. The sampling instant is controlled by the switches S3 and S4. It is therefore not important that the input buffers switch off rapidly and at a well-defined point in time.

In the invented THA configuration, the problem with signal dependent switch ON-resistance is avoided since the switches are eliminated. The linearity of the input buffers can be simulated very accurately since all transistors work in a well-modelled region. This enables a design procedure, which allows the user to analyse the behaviour of the circuit at high input frequencies and perform the necessary tradeoffs. Generally the linearity of the input buffer at high frequencies can be improved by increasing the bias currents. In the new-configuration the problem of designing a switch witch constant ON-resistance is reduced to the design of a buffer amplifier. This advantageous since good buffer amplifiers are known from prior art.

Figure 4:
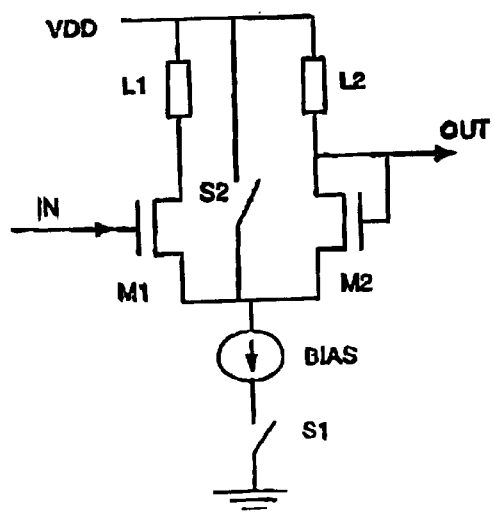
FIG. 4 is a more detailed schematic circuit diagram of a preferred embodiment of one of the voltage follower buffers of FIG. 3 implemented as a differential pair with unity gain feedback.

An example of a buffer amplifier is shown in FIG. 4. VDD is the supply voltage of the circuit. When EN is equal to one, the switch S1 is closed and S2 is open. In this configuration, FIG. 4 shows a simple differential pair with unity gain feedback, which illustrates a voltage follower buffer. The configuration for the buffer can be altered to fulfill the desired specification. With EN equal to zero, switch S2 is closed and S1 is open. This turns off the bias current of the buffer and ties the source of the input transistors M1 and M2 to the supply voltage. The input transistors turn completely off, and the output impedance of the circuit is equal to the load impedance L2.

The input buffers can be implemented as so-called source-followers or as operational amplifiers. The enable input can be implemented by switching off the bias current to the amplifier. In addition, it must be ensured that the output impedance is high enough when the buffer is off. The requirements to the buffer output impedance are set by the output impedance of the OTA and the requirement to the OTA open loop gain. If the buffer output impedance becomes too small, the OTA gain decreases, resulting in poor accuracy of the output voltage.

The invented configuration can be adapted to any switched capacitor circuit where switch ON-resistance limits the system performance.

What is claimed is:

1. A switched capacitor track and hold amplifier comprising:

an input signal connector;

a clock signal connector;

an input buffer amplifier based on a differential pair with a feedback loop having a buffer input, a buffer output, and a buffer enable, the buffer input being electrically coupled to the input signal connector, the buffer enable being electrically coupled to the clock signal connector, the input buffer amplifier having a high output impedance when the clock signal connector is at a first voltage level;

a sampling capacitor having a first plate and a second plate, the first plate being electrically coupled to the buffer output;

an operational transconductance amplifier having an amplifier input and an amplifier output, the amplifier input being electrically coupled to the second plate of the sampling capacitor;

a switch having a first switch side, a second switch side, and a switch enable, the first switch side being electrically coupled to the second plate of the sampling capacitor, the switch enable being electrically coupled to the clock signal connector, the switch being closed when the clock signal connector is at a second voltage level, the second voltage level being different than the first voltage level; and a ground connection, the ground connection being electrically coupled to the second switch side.

2. A switched capacitor track and hold amplifier comprising:

an input signal connector;

a clock signal connector;

a voltage follower buffer comprising an input buffer amplifier using a differential pair with a unity gain feedback, the voltage follower buffer having a buffer input, a buffer output, and a buffer enable, the buffer input being electrically coupled to the input signal connector, the buffer enable being electrically coupled to the clock signal connector, the voltage follower buffer having a high output impedance when the clock signal connector is at a first voltage level;

a sampling capacitor having a first plate and a second plate, the first plate being electrically coupled to the buffer output;

an operational transconductance amplifier having an amplifier input and an amplifier output, the amplifier input being electrically coupled to the second plate of the sampling capacitor;

a switch having a first switch side, a second switch side, and a switch enable, the first switch side being electrically coupled to the second plate of the sampling capacitor, the switch enable being electrically coupled to the clock signal connector, the switch being closed when the clock signal connector is at a second voltage level, the second voltage level being different than the first voltage level; and a ground connection, the ground connection being electrically coupled to the second switch side.

* * * * *

UNITED STATES PATENT AND TRADEMARK OFFICE
CERTIFICATE OF CORRECTION

PATENT NO.    : 6,310,515 B1
DATED         : October 30, 2001
INVENTOR(S)   : Oystein Moldsvor Page 1 of 1

It is certified that error appears in the above-identified patent and that said Letters Patent is hereby corrected as shown below:

<u>Column 1,</u>
Line 40, add a space after $(V_t)$

<u>Column 2,</u>
Line 37, replace "MOs" with -- MOS --
Line 59, replace "EN is equal to zero" with -- EN equal to zero --

<u>Column 3,</u>
Line 8, replace "this advantageous since good" should be -- "this is advantageous since good"... --

Signed and Sealed this

Fourteenth Day of May, 2002

Attest:

JAMES E. ROGAN
*Attesting Officer*     *Director of the United States Patent and Trademark Office*